United States Patent [19]
Maciolek et al.

[11] 3,902,924
[45] Sept. 2, 1975

[54] GROWTH OF MERCURY CADMIUM TELLURIDE BY LIQUID PHASE EPITAXY AND THE PRODUCT THEREOF

[75] Inventors: Ralph B. Maciolek, Bloomington; Charles J. Speerschneider, Minnetonka, both of Minn.

[73] Assignee: Honeywell Inc., Minneapolis, Minn.

[22] Filed: Aug. 30, 1973

[21] Appl. No.: 393,264

[52] U.S. Cl. .................. 148/1.5; 148/171; 148/172; 148/173; 148/33; 252/62.3 R; 252/62.3 ZT; 427/76

[51] Int. Cl.$^2$ .............................. H01L 7/62

[58] Field of Search ............................ 148/171–173, 148/1.5; 252/62.3 R, 62.3 ZT; 317/235 N; 117/201

[56] References Cited

UNITED STATES PATENTS

| | | | |
|---|---|---|---|
| 3,188,594 | 6/1965 | Koller et al. | 252/62.3 ZT |
| 3,611,069 | 10/1971 | Galginaitis et al. | 317/235 R |
| 3,642,529 | 2/1972 | Lee et al. | 252/62.3 R |
| 3,650,822 | 3/1972 | Grabmaier | 117/201 |
| 3,705,825 | 12/1972 | Touchy et al. | 148/1.5 |
| 3,713,900 | 1/1973 | Suzuki | 148/1.5 |
| 3,718,511 | 2/1973 | Moulin | 148/171 |
| 3,723,190 | 3/1973 | Kruse et al. | 148/1.5 |
| 3,725,135 | 4/1973 | Hager et al. | 148/1.5 |
| 3,791,887 | 2/1974 | Deitch | 148/172 |

*Primary Examiner*—G. Ozaki
*Attorney, Agent, or Firm*—David R. Fairbairn

[57] ABSTRACT

Thin layers of mercury cadmium telluride, (Hg,Cd)Te, are formed by liquid phase epitaxy.

33 Claims, 17 Drawing Figures

SAMPLE 45

GROWTH OF MERCURY CADMIUM TELLURIDE BY LIQUID PHASE EPITAXY AND THE PRODUCT THEREOF

REFERENCE TO COPENDING APPLICATIONS

Reference should be made to a copending application Ser. No. 393,265 by R. B. Maciolek, R. A. Skogman, and C. J. Speerschneider entitled "Substrate Preparation" which was filed on even date herewith and which is assigned to the same assignee as the present application, now U.S. Pat. No. 3,884,788.

BACKGROUND OF THE INVENTION

The invention herein described was in part made under a contract with the Department of the Army. The present invention is concerned with the growth of mercury cadmium telluride. In particular, the present invention is directed to low temperature growth of mercury cadmium telluride layers on insulating substrates by liquid phase epitaxy. For the purposes of this specification, the common chemical equations for mercury cadmium telluride, (Hg,Cd)Te or $Hg_{1-x}Cd_xTe$, will be used.

(Hg,Cd)Te is an intrinsic photodetector material which consists of a mixture of cadmium telluride, a wide gap semiconductor (Eg=1.6 eV), with mercury telluride, which is a semi-metal having a "negative energy gap" of about −0.3 eV. The energy gap of the alloy varies linearly with $x$, the mole fraction of cadmium telluride in the alloy. By properly selecting $x$, it is possible to obtain (Hg,Cd)Te detector material having a peak response over a wide range of infrared wavelengths.

(Hg,Cd)Te is of particular importance as a detector material for the important 8 to 14 micron atmospheric transmission "window." Extrinsic photoconductor detectors, notably mercury doped germanium, have been available with high performance in the 8 to 14 micron wavelength interval. These extrinsic photoconductors, however, require very low operating temperatures (below 30°K). (Hg,Cd)Te intrinsic photodetectors having a spectral cutoff of 14 microns, on the other hand, are capable of high performance at 77°K.

The possible application of (Hg,Cd)Te as an intrinsic photodetector material for infrared wavelengths was first suggested by W. G. Lawson et al., *J. Phys. Chem. Solids*, 9, 325 (1959). Since that time extensive investigation of (Hg,Cd)Te has been performed. High performance (Hg,Cd)Te detectors have been achieved for wavelengths from about 1 to 30 microns.

Despite the potential advantages of (Hg,Cd)Te as an infrared detector material, (Hg,Cd)Te photodetectors have only recently found wide use in infrared detector systems. The main drawback of (Hg,Cd)Te has been difficulty in preparing high quality, uniform material in a consistent manner. The preparation of (Hg,Cd)Te crystals having n type conductivity, which is the desired conductivity type for photoconductive detectors, has been found to be particularly difficult.

Several properties of the Hg-Cd-Te alloy system cause the difficulties which have been encountered in preparing (Hg,Cd)Te. First, the phase diagram for the alloy shows a marked difference between the liquidus and solidus curves, thus resulting in segregation of CdTe with respect to HgTe during crystal growth. Conventional crystal growth methods, which involve slow cooling along the length of an ingot, produce an extremely inhomogenous body of (Hg,Cd)Te. Second, the high vapor pressure of Hg over the melt makes it difficult to maintain melt stoichiometry. Third, the segregation of excess Te can give rise to pronounced constitutional supercooling.

The crystal preparation technique which has been most successful in producing high quality (Hg,Cd)Te is the technique described by P. W. Kruse et al. in U.S. Pat. No. 3,723,190. This technique involves the bulk growth of homogenous (Hg,Cd)Te alloy crystals by a three part method. First, a liquid solution of the desired alloy composition is quenched to form a solid body of (Hg,Cd)Te. Second, the body is annealed at a temperature near but below the solidus temperature to remove dendrites. Third, the (Hg,Cd)Te is annealed at low temperature in the presence of excess Hg to adjust stoichiometry. This final low temperature anneal takes about 30 days. Although detectors fabricated from material grown by this method exhibit very high performance, they generally are not radiative lifetime limited. This implies that foreign atoms or stoichiometric defects remain in the lattice and act as trapping or recombination centers.

Other bulk growth techniques have also been investigated. Zone melting methods for preparing (Hg,Cd)Te have been developed by B. E. Bartlett et al., *J. Mater. Sci.*, 4, 266 (1969); E. Z. Dzuiba, *J. of Electrochem. Soc.*, 116, 104 (1969); and R. Ueda et al., *J. Crystal Growth*, 13/14, 668 (1972). Still other bulk growth techniques for (Hg,Cd)Te have been described by J. Blair et al., *Conference on Metallurgy of Elemental and Compound Semiconductors*, 12, 393 (1961) and J. C. Woolley et al., *J. Phys. Chem. Solids*, 13, 151 (1960).

All of the bulk growth techniques require additional post-growth processing steps. The crystal must be sliced and the surface prepared by polishing and etching. The (Hg,Cd)Te slice is then epoxied to a substrate such as germanium. This is a particular disadvantage in the fabrication of detector arrays, since it is inconvenient, expensive, and generally unsatisfactory to fabricate arrays by assembling discrete detector elements.

The epoxy layer, in addition to complicating detector and detector array fabrication, results in a thermal barrier between the (Hg,Cd)Te and the substrate. This thermal barrier can adversely affect performance in many device applications.

Epitaxial growth techniques offer the possibility of eliminating the epoxy layer and avoiding many of the post-growth processing steps required for bulk growth techniques. An epitaxial layer is a smooth continuous film grown on a substrate, such that the film crystal structure corresponds to and is determined by that of the substrate. The desired epitaxial layer is single crystal with uniform thickness and electrical properties. The substrate has a different composition or electrical properties from that of the epitaxial layer.

Vapor phase epitaxial growth techniques have been investigated in an attempt to grow (Hg,Cd)Te layers. One vapor phase epitaxial growth technique which has been investigated is the vapor transport of the three constituent elements to a substrate with compound and alloy formation at that point. The vapor transport generally involves additional materials as transport agents, such as halogens. The vapor transport techniques have been described by R. Ruehrwein (U.S. Pat. No. 3,496,024), G. Manley et al. (3,619,282), D. Carpenter et al. (3,619,283), and R. Lee et al. (3,642,529).

Another vapor phase epitaxial growth process has been studied by R. J. Hager et al. (3,725,135) and by G. Coehn-Solal et al., *Compt. Rend.*, 261, 931 (1965). This approach involves an evaporation--diffusion mechanism without the use of any additional materials as transport agents. In this method a single crystal wafer of CdTe is used as the substrate, and either HgTe or (Hg,Cd)Te is used as the source. At a high enough temperature the material evaporates from the source and migrates in the vapor phase to the CdTe substrate, on which it deposits epitaxially.

In general, epitaxial films of (Hg,Cd)Te formed by vapor phase techniques have been less satisfactory than (Hg,Cd)Te crystals formed by bulk growth. The epitaxial films generally exhibit a compositional gradient along the crystal growth direction which has made them less desirable for detector applications.

Other epitaxial growth techniques have also been attempted. R. Ludeke et al., *J. Appl. Phys.*, 37, 3499 (1966), grew epitaxial films of (Hg,Cd)Te on single crystal barium fluoride substrates by flash evaporation in vacuum. The samples were grown for studies of optical properties. The technique is probably not practical for the preparation of detector material. H. Krause et al., *J. Electrochem. Soc.*, 114, 616 (1967), deposited films of (Hg,Cd)Te on single crystal substrates of sodium chloride, germanium and sapphire by means of cathodic sputtering. The resulting films were amorphous as deposited and became crystalline only upon subsequent annealing. Thus this approach does not appear to be promising. The formation of (Hg,Cd)Te by mercury ion bombardment of CdTe has been attempted by N. Foss, *J. Appl. Phys.*, 39, 6029 (1968). This approach was not successful in forming an epitaxial layer.

Another epitaxial growth technique, liquid phase epitaxy, has been used with success in growing other semiconductor materials and in growing garnets for bubble memory applications. In particular, liquid phase epitaxy has been used successfully in the preparation of gallium arsenide, gallium phosphide, and lead tin telluride. These materials generally differ from (Hg,Cd)Te, however, in that they (GaAs and GaP) do not have the severe segregation problem present in (Hg,Cd)Te, nor do they have the problem of high vapor pressure of mercury over the melt.

U.S. Pat. No. 3,718,511 by M. Moulin, which describes liquid phase epitaxial growth of lead tin telluride and lead tin selenide, suggests that analogous growth arrangements could be made for the alloys zinc selenide telluride and (Hg,Cd)Te. The patent, however, gives specific examples of liquid phase epitaxy only for lead tin telluride and lead tin selenide. Despite the suggestion by Moulin, prior attempts to grow (Hg,Cd)Te by liquid phase epitaxy have proved unsuccessful. Thermodynamic considerations or experimental difficulties have prevented achievement of detector-grade (Hg,Cd)Te material.

SUMMARY OF THE INVENTION

High quality detector-grade (Hg,Cd)Te layers have been formed on a substrate by the liquid phase epitaxial growth technique of the present invention. A liquid solution of Hg, Cd, and Te is formed and is contacted with a substrate. The liquid solution proximate the surface of the substrate has a liquidus temperature which is substantially identical to the solidus temperature of a desired (Hg,Cd)Te composition. Supersaturation and growth of a layer of (Hg,Cd)Te on the substrate is then produced.

DETAILED DESCRIPTION OF THE PREFERRED EMBODIMENTS

Liquid Phase Epitaxial Growth

In the method of the present invention, a nearly saturated liquid solution of Hg, Cd, and Te is formed in a sealed container. The liquid solution has a liquidus temperature which is substantially identical to the solidus temperature of the desired (Hg,Cd)Te composition. The liquid solution is then brought in contact with a substrate mounted within the sealed container. The solution is cooled to produce supersaturation, which results in the growth of a thin layer or film of (Hg,Cd)Te on the substrate.

Figures 1A, 1B, 1C:
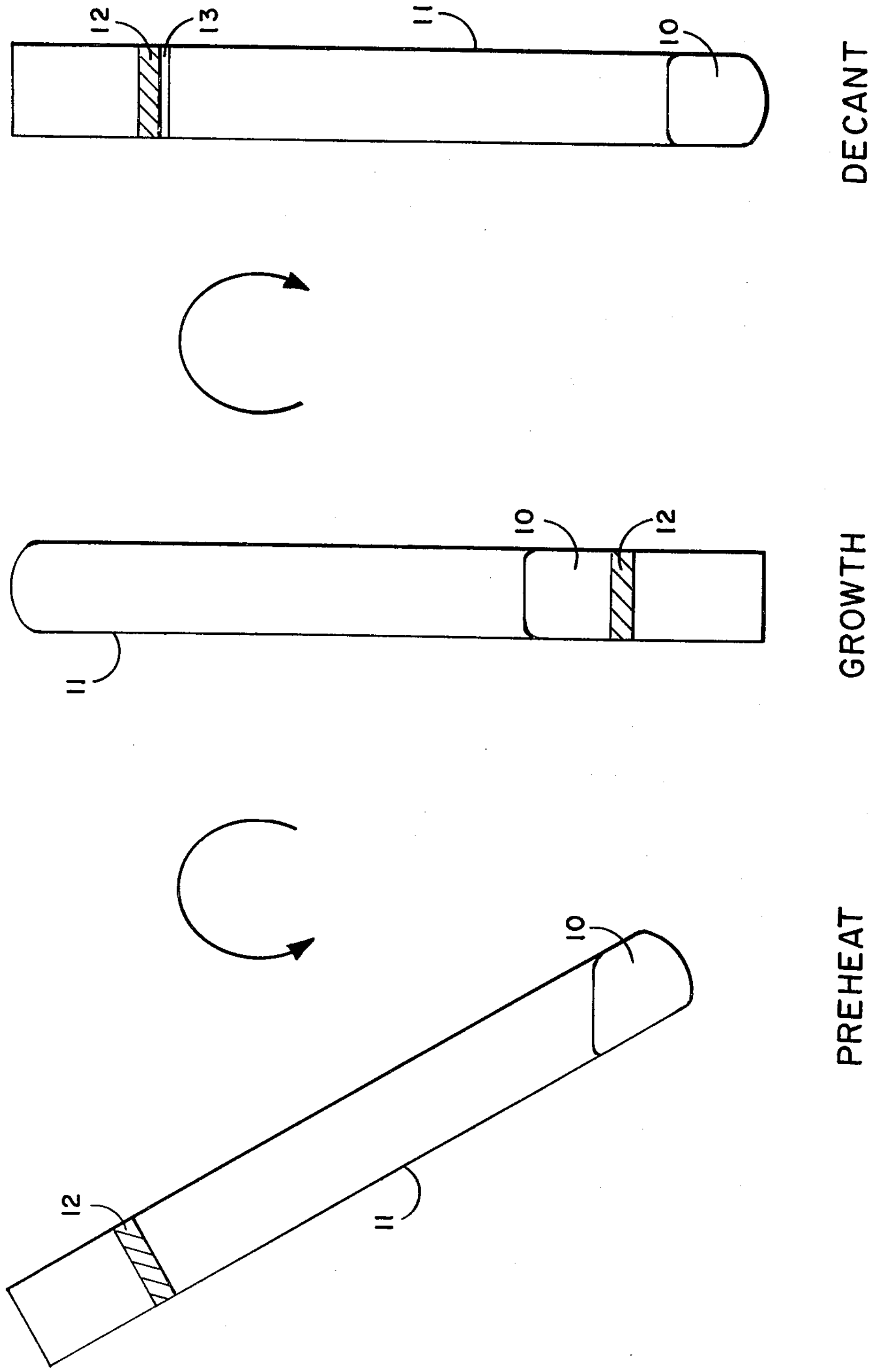
FIGS. 1*a*, 1*b*, and 1*c* schematically illustrate the technique used to grow layers of (Hg,Cd)Te by liquid phase epitaxy.

FIGS. 1*a*, 1*b*, and 1*c* schematically illustrate the apparatus and technique used to grow thin layers of (Hg,Cd)Te by liquid phase epitaxy. In FIG. 1*a*, liquid solution 10 of Hg, Cd, and Te is formed in one end of sealed container 11 by heating the individual constituents (Hg, Cd, and Te), or HgTe and CdTe, or a prevously cast ingot of (Hg,Cd)Te to a temperature above the liquidus temperature. Substrate 12 is mounted at the other end of the sealed container 11. When the growth conditions are established, container 11 is tilted to allow the liquid solution to flow onto substrate 12, as shown in FIG. 1*b*. The driving force for solidification of (Hg,Cd)Te alloy material on substrate 12 is supersaturation of the liquid solution produced by means of (1) a temperature gradient ($\Delta T$) through the thickness of the substrate, (2) controlled cooling of the entire liquid solution, or (3) a combination of the two. Container 11 is held in this position until growth of (Hg,Cd)Te layer 13 is completed. At that time, excess liquid solution is removed from contact with the substrate by tipping the sealed container 11 back to its original position, as shown in FIG. 1*c*.

Figure 2:
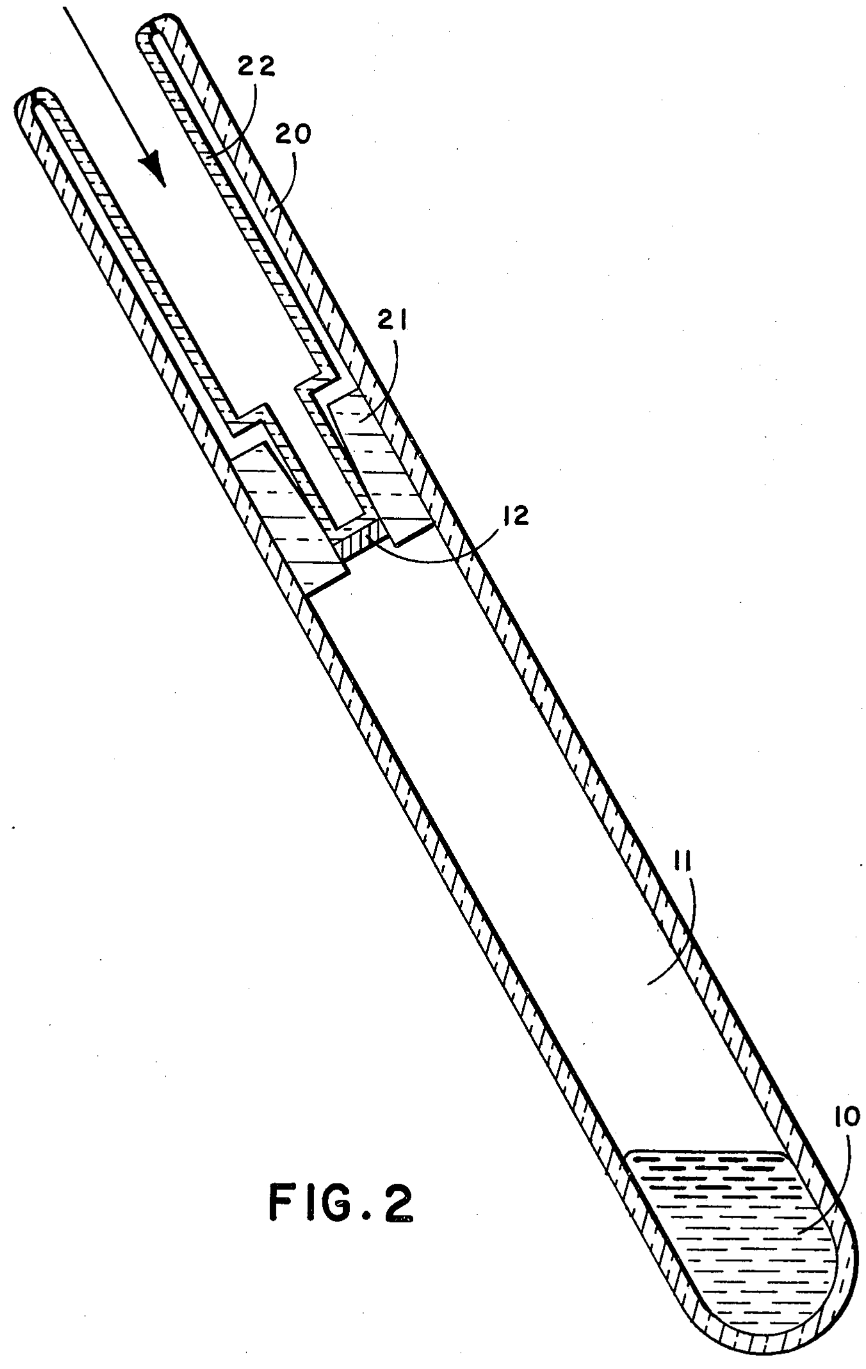
FIG. 2 schematically shows preferred apparatus for the growth of (Hg,Cd)Te layers by liquid phase epitaxy.

In one preferred embodiment, the apparatus shown in FIG. 2, was used to grow (Hg,Cd)Te layers by liquid phase epitaxy. Sealed container 11 comprised a quartz ampoule 20 having a total length of about 425 mm. About 200 mm from the closed end of ampoule 20 a quartz sleeve 21 was mounted inside the ampoule 20. Sleeve 21 had an inside diameter of about 8 mm at one end and about 7.5 mm at the other end. Substrate 12, which had a diameter of about 7.5 mm, was inserted into sleeve 21. Substrate 12 was maintained in position by the slight taper of sleeve 21 and by pressure from insert 22, which pressed against the back surface of the substrate 12. The ends of insert 22 and ampoule 20 were sealed together.

Figure 3:
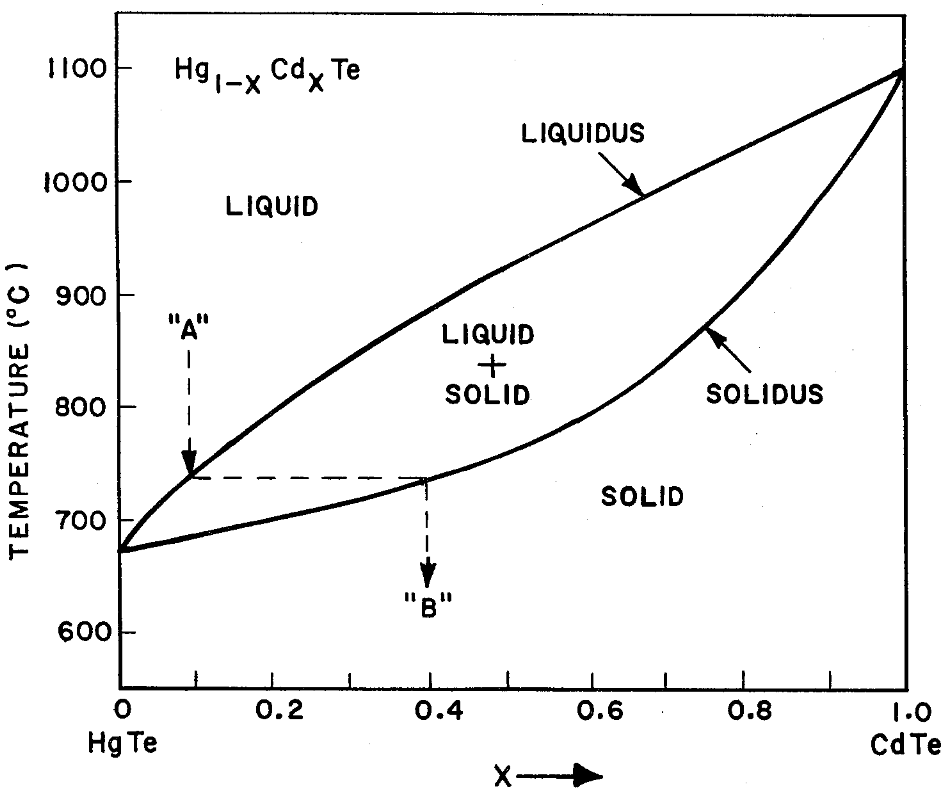
FIG. 3 shows the HgTe-CdTe pseudo-binary phase diagram.

The HgTe-CdTe pseudo-binary phase diagram is shown in FIG. 3. The HgTe--CdTe pseudo-binary system is an isomorphous system in which the two constituents form a completely miscible, pseudo-binary solid solution with a melting range rather than a congruent melting point. As described previously, solidification of large volumes of homogenous (Hg,Cd)Te is very difficult because of the large range of composition and temperature over which solidification occurs.

An example of the solidification of (Hg,Cd)Te is shown in FIG. 3. An alloy of composition A ($x \approx 0.1$) is entirely liquid at temperatures above the liquidus curve. Solidification begins as the liquid is cooled to a temperature just below the liquidus temperature. The first solid (Hg,Cd)Te alloy formed has a composition B ($x \approx 0.4$), which is given by the intersection of the horizontal or "tie line" with the solidus curve. For solidification to continue, the temperature must be lowered further. As a result, the composition of the liquid (Hg,Cd)Te and the subsequent solid (Hg,Cd)Te changes. The liquid (Hg,Cd)Te increases in HgTe content following the liquidus curve, while the solid (Hg,Cd)Te formed increases in HgTe content following the solidus curve.

In the liquid phase epitaxial growth method of the present invention, a thin layer of composition B is formed on a substrate by growth from a melt of composition A. The liquidus temperature of composition A is substantially identical to the solidus temperature of composition B. The liquid phase epitaxial growth method involves the solidification of a very small volume of solid from a large volume of melt so that the composition of the melt does not change substantially during growth. As a result, the epitaxial layer shows very little compositional variation through the thickness of the film.

An important advantage of liquid phase epitaxy of (Hg,Cd)Te is that it enables growth of the epitaxial layers of composition B at lower temperatures than are required for direct solidification of a melt of composition B. As shown in FIG. 3, liquid phase epitaxial growth of $x=0.4$ (Hg,Cd)Te is achieved at less than 750°C, whereas direct solidification of a melt of $x=0.4$ by quenching requires growth at nearly 900°C.

Defects in (Hg,Cd)Te

An important advantage of liquid phase epitaxial growth of (Hg,Cd)Te is the reduction and control of defects. In any semiconductor, the electrical and optical properties can generally be significantly altered through the introduction of relatively small concentrations of defects into the lattice. Low temperature and low background evaluation of detectors fabricated from (Hg,Cd)Te show that residual point defects such as foreign atoms or stoichiometric defects are indeed the principal factors affecting performance and that there exits a desirable optimum level. Optimization of the semiconducting properties in (Hg,Cd)Te therefore depends on the control of the type and concentration of such defects, not their elimination.

The two types or classes of defects which can influence the properties of semiconductors such as (Hg,Cd)Te are (1) stoichiometric or native defects and (2) foreign impurities. Examples of stoichiometric point defects in (Hg,Cd)Te include interstitial atoms, misplaced ions and vacancies, and associates and clusters of the atoms, ions and vacancies. These types of defects are thermodynamically stable for temperatures greater than 0°K. As a result, the (Hg,Cd)Te compound can have a range of metal (Hg or Cd) to nonmetal (Te) ratios for which it is stable. This single-phase range in composition is called the "existence region." It can be shown that the concentration of stoichiometric point defects increases exponentially with growth temperature and with annealing temperature.

Foreign impurity defects are usually regarded as being undesirable in high quality photodetector material. An extremely minute amount of foreign impurities may have a substantial effect on the electrical and optical properties of the photodetector material. Like stoichiometric defects, foreign impurity defects increase with growth temperature.

Liquid phase epitaxial growth of (Hg,Cd)Te presents an opportunity to control stoichiometric and foreign impurity defects. As described previously, liquid phase epitaxial growth of (Hg,Cd)Te may be achieved at a temperature which is substantially less than the temperature required for direct solidification of (Hg,Cd)Te of the same $x$ value.

Examples of (Hg,Cd)Te Liquid Phase Epitaxial Growth

The growth of high quality, detector grade (Hg,Cd)Te layers by liquid phase epitaxy is described in the following examples. The sizes of the ampoules, substrates, and melt charge described in the examples were selected on the basis of convenience. The amounts and the sizes described may be either increased or decreased depending upon the surface area of the epitaxial layer desired. Similarly, although cast ingots of prereacted (Hg,Cd)Te were used as starting material for the melt, proper amounts of elemental Hg, Cd, and Te could also be used.

Table 1, which follows the Examples, is a summary of the growth conditions and properties of the samples described in the examples. In each Example, the amount of mercury plus cadmium approximately equaled the amount of tellurium in the liquid solution. In other words, the liquid solution contained about $1 - x$ mole part mercury, about $x$ mole part cadmium, and about 1 mole part tellurium, where $x$ is between 0 and 1.

EXAMPLE 1

The 13 to 15 gram ingot of (Hg,Cd)Te having about 20.0 mole % CdTe and 80.0 mole % HgTe was cast for use as starting material for growth of (Hg,Cd)Te with $x=0.55$. The cast ingot contained a slight excess of mercury. The cast ingot was placed in one end of a sealed quartz container having an inside diameter of about 12.5 mm and a length of about 200 mm. A CdTe substrate of about 7.5 mm diameter was placed in the opposite end of the container. The cast ingot was then heated to a temperature above the liquidus temperature (about 800°C) to form a liquid solution of Hg, Cd and Te.

Liquid phase epitaxial growth was then achieved by tilting the container to allow the liquid (Hg,Cd)Te to flow onto the substrate. The driving force for solidification of (Hg,Cd)Te alloy on the CdTe substrate was supersaturation of the melt produced by a temperature gradient $\Delta T$ of greater than 100°C (preferably about 130°C). The temperature gradient, which was established by cooling the back of the CdTe substrate by means of blowing air, extended through the thickness of the substrate in a direction normal to the surface of the substrate. After the liquid solution had been in contact for about 10 seconds to about 3 minutes, the container was tilted back to its original position to pour excess liquid solution off the substrate. Samples 3 through 9 were prepared by this technique.

EXAMPLE 2

Samples 13 through 17 were prepared by a method substantially similar to the method of Example 1. A 13 to 15 gram ingot of (Hg,Cd)Te having 6.5 mole % CdTe and 93.5 mole % HgTe was cast for use as starting material for growth of (Hg,Cd)Te with $x$=0.20. The cast ingot was heated to a temperature above the liquidus temperature (about 725°C) to form a liquid solution of Hg, Cd, and Te. The driving force for solidification was supersaturation of the melt produced by a temperature gradient $\Delta T$ of about 31°C.

EXAMPLE 3

Samples 21, 22, 23, 27, 30 through 45, 48, 50, 56, and 64 were grown from a 6.5 mole % CdTe-93.5 mole % HgTe solution. Unlike Examples 1 and 2, the driving force for solidification was the uniform cooling of the substrate and the liquid solution at a controlled rate. When the liquid solution was brought in contact with the substrate, the temperature of the solution was just above the liquidus temperature so that the solution was nearly saturated. This starting temperature was in the range of about 715°C to about 725°C. The solution and the substrate were then cooled uniformly to a temperature in the range of about 690°C to about 720°C. The cooling rate used ranged from about 0.5°c per minute to about 6°C per minute. The uniform cooling caused supersaturation and growth of a (Hg,Cd)Te layer on the surface of the substrate.

EXAMPLE 4

Sample 46 was grown by a process similar to the one described in Example 3 except the driving force for solidification was the temperature gradient existing in the growth apparatus. The starting and decant temperatures were 718°C.

EXAMPLE 5

Although the pseudo-binary phase diagram indicates that a solution of 6.5 mole % CdTe--93.5 mole % HgTe has a liquidus temperature substantially identical to the solidus temperature of $x$=0.20 (Hg,Cd)Te, the layers grown by the methods described in Examples 2 through 4 generally exhibited an $x$ greater than 0.20. It is believed that this discrepancy was caused by dissolution of a portion of the CdTe substrate at the initiation of growth and by diffusion between the CdTe layer after growth. In an attempt to prepare a layer of $x$=0.20, an approximately 13 gram ingot of 3.5 mole % CdTe and 96.5 mole % HgTe was used as the starting material. The driving force for solidification was uniform cooling at a rate of about 0.1°C/min to about 4.0°C/min. Starting temperatures ranged from about 694°C to about 715°C, and decant temperatures ranged from about 686°C to about 705°C. Samples 47, 51, 53, 65, 66, 67, 69, 72, 76, 86, 87, 88, 92, 93, 94, 96, and 101 were prepared by this method.

EXAMPLE 6

Samples 58 and 62 were grown under static conditions similar to those described in Example 4. The starting solution was 3.5 mole % CdTe and 96.5 mole % HgTe. Starting and decant temperatures were 700°C for Sample 58 and 695°C for Sample 62.

EXAMPLE 7

In each of the preceeding examples, a (Hg,Cd)Te epitaxial layer was grown on a CdTe substrate. (Hg,Cd)Te layers were also grown on (111) and (100) oriented substrates of silicon by techniques generally similar to those described in Examples 2 and 3. Samples 12 and 25 were grown on silicon substrates.

EXAMPLE 8

The results of Example 7 indicated that nucleation and growth of (Hg,Cd)Te on silicon substrates is more difficult than on CdTe substrates. It is believed that the major factor contributing to the difficulty is the oxide layer that forms on silicon at room temperature. In an attempt to overcomee this difficulty, a (110) oriented silicon substrate was sputter etched or chemically etched to remove the oxide layer. A layer of CdTe of about 500 A to 1,000 A thickness was sputter deposited on the etched surface. The CdTe coated silicon substrate was then used as a substrate for liquid phase epitaxial growth of (Hg,Cd)Te. The growth procedure was essentially identical to the procedure of Example 5. Samples 73 and 77 were prepared by this process.

EXAMPLE 9

Epitaxial growth of (Hg,Cd)Te on germanium substrates was also attempted. The starting material for growth was a 15 gram ingot of (Hg,Cd)Te having 6.5 mole % CdTe and 93.5 mole % HgTe. The procedures used were substantially the same as those described in Example 3. The germanium substrate dissolved, and no growth was achieved.

EXAMPLE 10

Liquid phase epitaxial growth of (Hg,Cd)Te was also attempted on (100) and (110) spinel ($MgAl_2O_4$) substrates. The procedures and growth conditions were essentially the same as those described in Example 5 and in Example 8. Growth of (Hg,Cd)Te layers directly on spinel by the method of Example 5 was not successful. When the method of Example 8 was used, on the other hand, growth of (Hg,Cd)Te layers on CdTe coated (100) and (110) spinel substrates was achieved. Samples 78, 82, 90 and 91 were continuous (Hg,Cd)Te layers grown on spinel substrates and Sample 81 was a discontinuous (Hg,Cd)Te layer on spinel.

EXAMPLE 11

A (Hg,Cd)Te layer was also deposited on a sapphire ($Al_2O_3$) substrate. The substrate was cleaned by sputter etching and a thin layer of CdTe was deposited on the substrate by sputtering. Samples 98 and 99 were prepared by this method. Sample 98 resulted in no (Hg,Cd)Te layer, while Sample 99 was a thick (Hg,Cd)Te layer on a sapphire substrate.

NOTE: TABLE 1

In Table 1, blanks have been left for the thickness and conductivity type of several samples. A blank indicates that no thickness or conductivity type measurements have been made on the sample.

In addition, no "decant temperature" is listed for Samples 3 through 9 and 13 through 17. These samples were grown with a temperature gradient rather than by uniform cooling from a "start temperature" to a "decant temperature".

TABLE 1

| Sample No. | Charge (x) | Substrate | Growth Conditions (T or Controlled Cooling) | Start Temp. (°C) | Decant Temp. (°C) | Thickness (microns) | Conductivity Type Thermoprobe 77°K | 300°K |
|---|---|---|---|---|---|---|---|---|
| 3 | .20 | CdTe | T=130°C (3 min) | 800 | | Thin | n | n |
| 4 | .20 | CdTe | T=130°C (3 min) | 800 | | Thick | — | — |
| 5 | .20 | CdTe | T=130°C (1 min) | 800 | | Thick | — | — |
| 6 | .20 | CdTe | T=130°C (1 min) | 800 | | Thick | — | — |
| 7 | .20 | CdTe | T=130°C (30 sec) | 800 | | No film | — | — |
| 8 | .20 | CdTe | T=130°C (10 sec) | 800 | | | — | — |
| 9 | .20 | CdTe | T=130°C (10 sec) | 800 | | Thin | — | — |
| 12 | .065 | Si(111) | T=84°C + cool | 736 | 652 | Thick | — | — |
| 13 | .065 | CdTe | T=31° C (3 min) | 697 | | Thick | — | — |
| 14 | .065 | CdTe | T=31°C (1 min) | 697 | | Thick | — | — |
| 15 | .065 | CdTe | T=31°C (3 min) | 697 | | Thin | n | p |
| 16 | .065 | CdTe | T=31°C (10 min) | 697 | | Thin | n | p |
| 17 | .065 | CdTe | T=31°C (1 min) | 697 | | Thin | n | n |
| 21 | .065 | CdTe | Cool (6°C/min) | 725 | 700 | Thin | n | n |
| 22 | .065 | CdTe | Cool (6°C/min) | 725 | 710 | Thin | — | — |
| 23 | .065 | CdTe | Cool (6°C/min) | 725 | 705 | | n | n |
| 25 | .065 | Si(100) | Cool (6°C/min) | 725 | 675 | Thick | n | n |
| 27 | .065 | CdTe | Cool (6°C/min) (Air cool after growth) | 725 | 700 | 80 | n | n |
| 30 | .065 | CdTe | Cool (0.75°C/min) | 725 | 700 | 75 | n | n |
| 31 | .065 | CdTe | Cool (0.75°C/min) | 725 | 710 | 27 | n | n |
| 32 | .065 | CdTe | Cool (0.67°C/min) | 725 | 715 | 9–26 | n | n |
| 33 | .065 | CdTe | Cool (0.9°C/min) | 725 | 720 | 11 | n&p | n&p |
| 34 | .065 | CdTe | Cool (0.9°C/min) | 725 | 720 | 13– 18 | p | n&p |
| 35 | .065 | CdTe | Cool (0.6°C/min) | 720 | 715 | 14–20 | p | n |
| 36 | .065 | CdTe | Cool (1.0°C/min) | 715 | 710 | 20 | | n&p |
| 37 | .065 | CdTe | Cool (0.69°C/min) | 725 | 710 | 16 | n&neu | n&neu |
| 38 | .065 | CdTe | Cool (5.0°C/min) | 725 | 700 | 93 | n&p | n |
| 39 | .065 | CdTe | Cool (0.55°C/min) | 725 | 700 | 105 | n&neu | n |
| 40 | .065 | CdTe | Cool (0.53°C/min) | 720 | 715 | 15 | — | — |
| 41 | .065 | CdTe | Cool (0.77°C/min) | 725 | 720 | 10.8 | n&neu | n&p |
| 42 | .065 | CdTe | Cool (4.0°C/min) | 725 | 720 | 18 | — | — |
| 43 | .065 | CdTe | Cool (5.0°C/min) | 725 | 715 | 11 | neu&p | n,p,neu |
| 44 | .065 | CdTe | Cool (4.0°C/min) | 720 | 715 | 26 | — | — |
| 45 | .065 | CdTe | Cool (4.0°C/min) | 715 | 710 | 36 | n&p | n&p |
| 46 | .065 | CdTe | Static (0°C/min) | 718 | 718 | 17 | n,p,neu | n&p |
| 47 | .035 | CdTe | Cool (0.75°C/min) | 705 | 690 | 69 | — | — |
| 48 | .065 | CdTe | Cool (0.68°C/min) | 725 | 700 | 200 | p&neu | n |
| 50 | .065 | CdTe | Cool (4.3°C/min) | 718 | 700 40 | — | — | |
| 51 | .035 | CdTe | Cool (3.85°C/min) | 710 | 700 | 11 | — | — |
| 53 | .035 | CdTe | Cool (4.0°C/min) | 715 | 705 | 9 | n | |
| 56 | .065 | CdTe | Cool (5.0°C/min) | 720 | 715 | | neu | n |
| 58 | .035 | CdTe | Static (0°C/min) | 700 | 700 | 8 | neu | neu |
| 62 | .035 | CdTe | Static (0°C/min) | 695 | 695 | 30 | n | n&p |
| 64 | .065 | CdTe | Cool (4.0°C/min) | 725 | 695 | 50 | neu | neu |
| 65 | .035 | CdTe | Cool (1.1°C/min) | 705 | 690 | 59 | n&p | n |
| 66 | .035 | CdTe | Cool (0.1°C/min) | 694 | 693 | 11 | neu | n&p |
| 67 | .035 | CdTe | Cool (0.4°C/min) | 695 | 697 | 9 | neu | neu |
| 69 | .035 | CdTe | Cool (1.47°C/min) | 700 | 686 | 46 | neu | n&neu |
| 72 | .035 | CdTe | Cool (1.0°C/min) | 705 | 690 | 35 | n,p, neu | n,neu |
| 73 | .035 | Si(110) (Sputtered) | Cool (1.3°C/min) | 695 | 670 | 42 | n | n&p |
| 76 | .035 | CdTe | Cool (0.75°C/min) | 705 | 690 | 40 | — | — |
| 77 | .035 | Si(110) (Chem. etch) | Cool (1.0°C/min) | 675 | 674 | 5 | neu | n&neu |
| 78 | .035 | Spinel(100) | Cool (1.0°C/min) | 675 | 674 | Thick | — | — |
| 81 | .035 | Spinel(100) (Sputtered) | Cool (1.3°C/min) | 680 (Subs)<br>692 (Melt) | 676 | No cont. film | neu | neu |
| 82 | .035 | Spinel(100) (Sputtered) | | 677 (Subs)<br>689 (Melt) | (Thermo-couple broke) | Thick | — | — |
| 86 | .035 | CdTe | Cool (4.0°C/min) | 705 | 690 | | neu | neu |
| 87 | .035 | CdTe | Cool (2.3°C/min) | 705 | 690 | | — | — |
| 88 | .035 | CdTe | Cool (1.2°C/min)<br>Cool (1.8°C/min) | 720<br>705 | 714<br>690 | | n&neu | n |
| 90 | .035 | Spinel(110) (Sputtered) | Cool (0.5°C/min) | 679 (Subs)<br>693 (Melt) | 678 | Thick | neu | neu&n |
| 91 | .035 | Spinel(110) (Sputtered) | Static | 685 (Subs)<br>697 (Melt) | 686 | Thick | — | — |

TABLE 1 – Continued

| Sample No. | Charge (x) | Substrate | Growth Conditions (T or Controlled Cooling) | Start Temp. (°C) | Decant Temp. (°C) | Thickness (microns) | Conductivity Type Thermoprobe 77°K – 300°K | |
|---|---|---|---|---|---|---|---|---|
| 92 | .035 | CdTe | Cool (2.7°C/min) | 705 (Subs)<br>710 (Melt) | 690 | | — | — |
| 93 | .035 | CdTe | Cool (2.0°C/min) | 705 | 690 | | n&neu | n |
| 94 | .035 | CdTe | Cool (2.6°C/min) | 705 | 690 | | — | — |
| 96 | .035 | CdTe | Cool (1.2°C/min) | 705 | 693 | | n | n |
| 98 | .065 | $Al_2O_3$(001) | Cool (1.33°C/min) | 715 | 695 | No film | — | — |
| 99 | .065 | $Al_2O_3$(001) | Cool (1.2°C/min) | 710 (Subs)<br>720 (Melt) | 690 | Thick | — | — |
| 101 | .035 | CdTe | Cool (1.0°C/min) | 705 (Subs)<br>710 (Melt) | 690 | Thin | n | n |

Evaluation of (Hg,Cd)Te Layers (Hg,Cd)Te layers grown using liquid phase epitaxy were evaluated for both their structural and electrical characteristics. The (Hg,Cd)Te layers were evaluated by visual observation, metallographic observation, electron beam microprobe analysis, conductivity type determination, and detector performance. From these evaluations, several conclusions are drawn as to the importance of substrate material and growth conditions.

Visual Observation

In crystal growth, visual observation can be used to assess the quality of as-grown layers. Dendritic or cellular morphology of an as-grown surface is indicative of rapid growth and probably non-uniformity in composition. A smooth or mirrorlike surface, on the other hand, is indicative of slower growth and uniformity in composition. (Hg,Cd)Te layers grown by liquid phase epitaxy have exhibited each of these surface types.

The preferred (Hg,Cd)Te layers exhibit uniform composition, uniform thickness, and a surface condition which requires no further surface preparation for the fabrication of detectors. In general, slower cooling rates and higher final or decant temperatures result in smooth, mirror-like surfaces which satisfy the surface condition requirements.

Metallographic Observation

In all of the layers deposited on CdTe substrates, an excellent bond between the as-grown film and the substrate was observed. In addition, structural characteristics of the CdTe substrates have been observed to continue into the (Hg,Cd)Te layer. This behavior is indicative of excellent bonding and true expitaxial growth of the (Hg,Cd)Te layer.

Examination of the cross-section of a typical as-grown thin (Hg,Cd)Te layer on a CdTe substrate shows that approximately 60% of the layer is uniform in thickness. This gives sufficient area for detector array fabrication.

Electron Beam Microprobe Analysis

Electron beam microprobe analysis provides an excellent means to determine composition and uniformity in composition of (Hg,Cd)Te layers grown by liquid phase epitaxy. Since most interest is in the 10 to 15 micron thick film adjacent to the substrate interface, a better than 1 to 1 observation of this region is desirable. The thin layers were therefore angle-lapped at about 6° so that the apparent height to transverse dimension was increased by 10 to 1. In other words, an actual 10 micron thick layer appeared 100 microns thick, thus resulting in greater accuracy in analysis of compositional uniformity.

FIGS. 4*a* through 4*e* show the composition of anglelapped (Hg,Cd)Te Samples 38, 39, 44, 47, and 65, respectively, as a function of distance. Each of the samples exhibited a compositional gradient through the thickness of the layer. The slope of this compositional gradient changed through the thickness of the layer and was dependent to some extent on both growth conditions and cooling rates after growth.

Figure 4A:
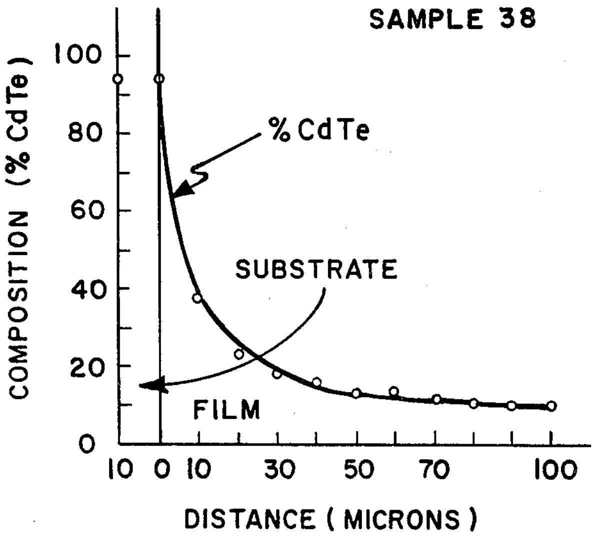
FIGS. 4*a* through 4*e* show composition as a function of distance for various angle-lapped (Hg,Cd)Te epitaxial layers.
Figure 4B:
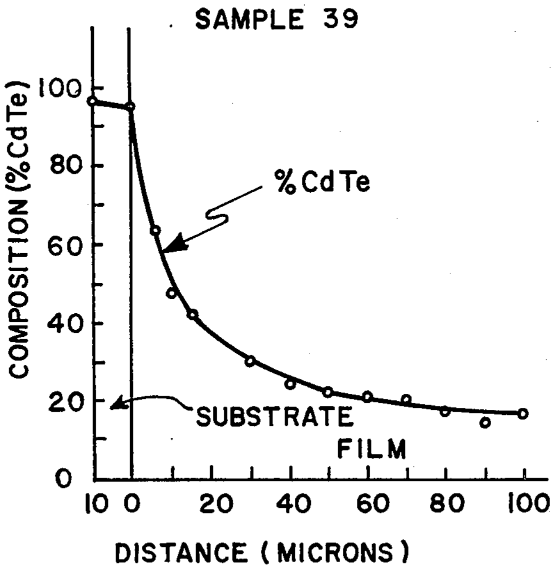
Figure 4C:
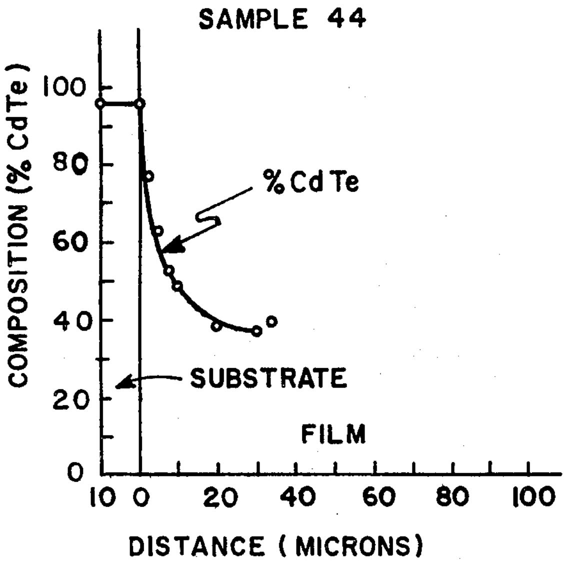

FIG. 4*a* shows the composition as a function of distance for Sample 38, a fairly thick film grown at a cooling rate of 5.0°C per minute with a starting temperature of 725°C and a final or "decant" temperature of 700°C. FIG. 4*b* shows a similar plot for Sample 39, which was grown at a slower cooling rate of 0.5°C per minute and the same starting and decant temperatures. The faster cooling rate results in a steeper compositional gradient and an as-grown surface having a lower $x$ value.

The plot of composition versus distance for Sample 44 (FIG. 4*c*) illustrates quite a different type of behavior. Growth conditions for this layer were a cooling rate of 5°C per minute and a decant temperature of 715°C. This sample was grown at the same cooling rate, but a higher decant temperature than Sample 38. The resultant final composition is considerably higher: $x$=0.38 for Sample 44 as compared to $x$=0.10 for Sample 38. It should also be noted that the layer thickness is different for the two samples. Sample 44 is a thin film (26 microns) as compared to Sample 38 (93 microns). These results indicate that the most significant growth parameter in determining compositional profile is the decant temperature. The higher the decant temperature, the higher the resultant composition.

The compositional gradient also appeared to be due in part to diffusion between the CdTe substrate and the (Hg,Cd)Te layer after growth of the layer. In one experiment, a (Hg,Cd)Te layer was quenched from the decant temperature (about 700°C) to room temperature shortly after the excess solution had been poured off. The compositional profile of the quenched layer showed a steeper compositional gradient than a layer grown under the same conditions but not quenched after growth.

Figure 4D:
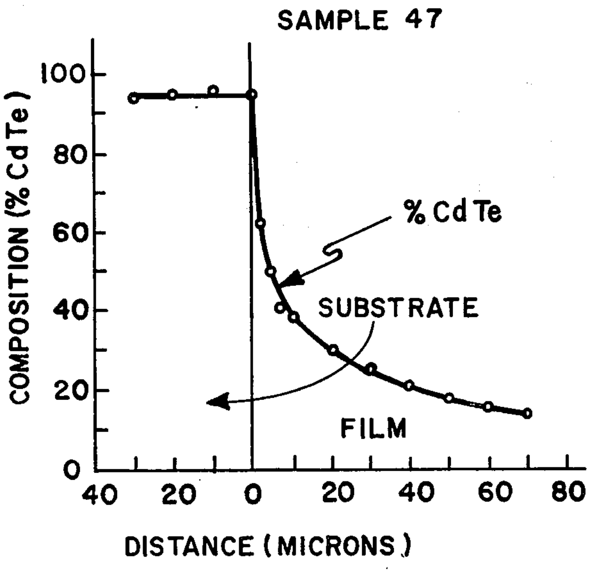
Figure 4E:
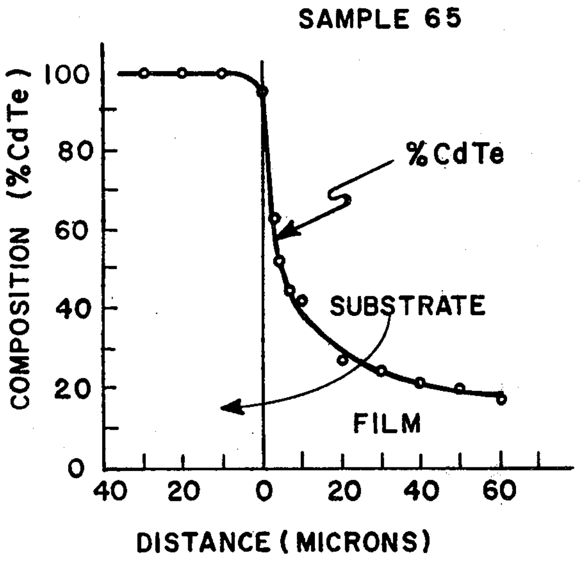

FIGS. 4*d* and 4*e* illustrate the reproducibility of the liquid phase epitaxial growth of (Hg,Cd)Te. Sample 65 was prepared using essentially the same growth conditions as Sample 47 in an attempt to duplicate the results of Sample 47. A comparison of FIG. 4*d*, which is the composition versus distance plot for Sample 47, with the plot for Sample 65 (FIG. 4*e*) illustrates a high degree of reproducibility.

Figure 5:
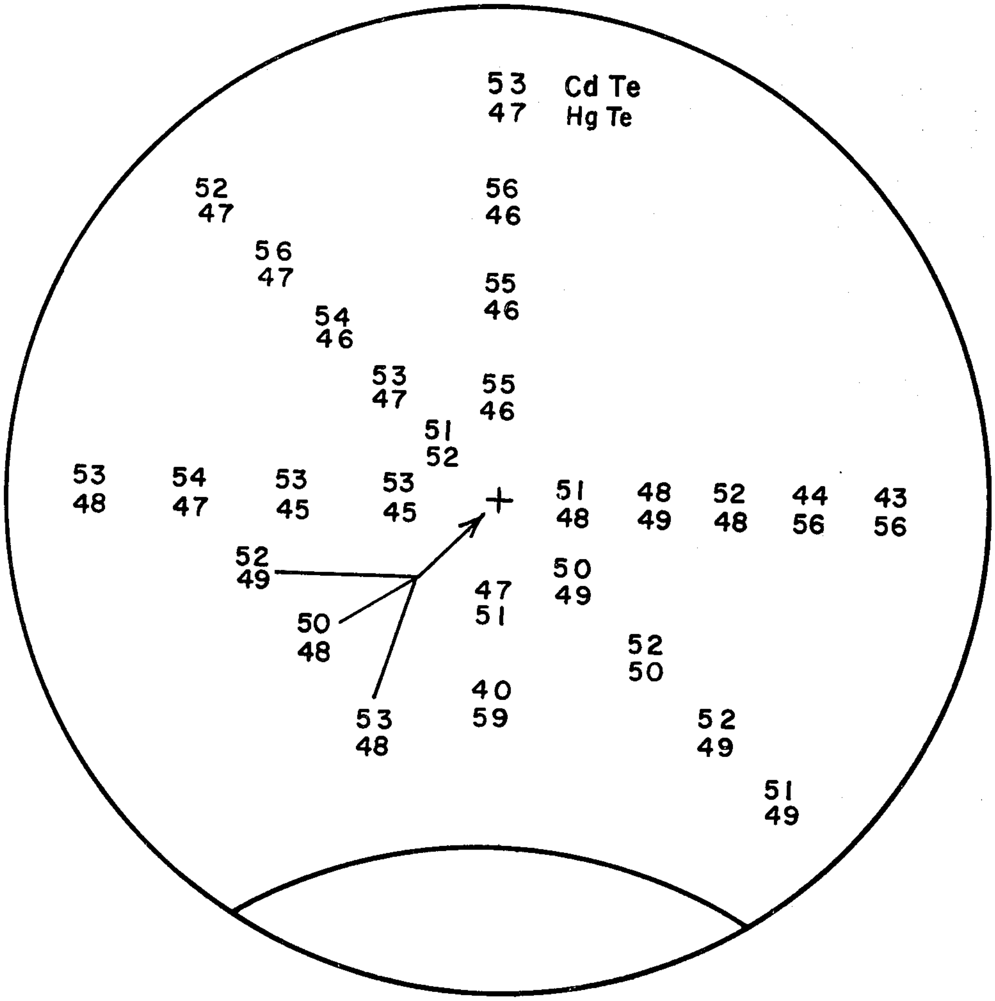
FIG. 5 shows composition at various positions on the surface of a (Hg,Cd)Te layer.

Electron beam microprobe analysis has also been used to determine the composition of the (Hg,Cd)Te layers across the surface of the layers. FIG. 5 shows the results of electron beam microprobe analysis on the surface of Sample 45. The top number of each pair of numbers in FIG. 5 represents the percentage of CdTe measured, and the lower number represents the percentage of HgTe measured. Visual observations of Sample 45 showed a smooth mirror-like surface indicative of good compositional uniformity. The electron beam microprobe measurements shown in FIG. 5 verify this uniformity in composition. The slight deviations in compositional uniformity can be associated with small surface irregularities which were noted in the visual observation of Sample 45.

Conductivity Type Determination

Thermoelectric probe measurements at room temperature (300°K) and at 77°K have been made to determine the conductivity type of the (Hg,Cd)Te layers grown by liquid phase epitaxy. Thermoelectric probe measurements of conductivity type must be used with caution since they do not always agree with conductivity type determined by Hall effect measurements and infrared detector performance. They do, however, give a preliminary indication of conductivity type.

The thermoelectric probe measurements of conductivity type at 300°K and 77°K for various (Hg,Cd)Te samples are listed in Table 1. As can be seen, the as-grown layers of (Hg,Cd)Te generally exhibited n type conductivity at room temperature and either n type or *n* and *p* type conductivity at 77°K. This is of importance since the best (Hg,Cd)Te photoconductive devices exhibit *n* type conductivity.

Detector Performance

Figure 6:
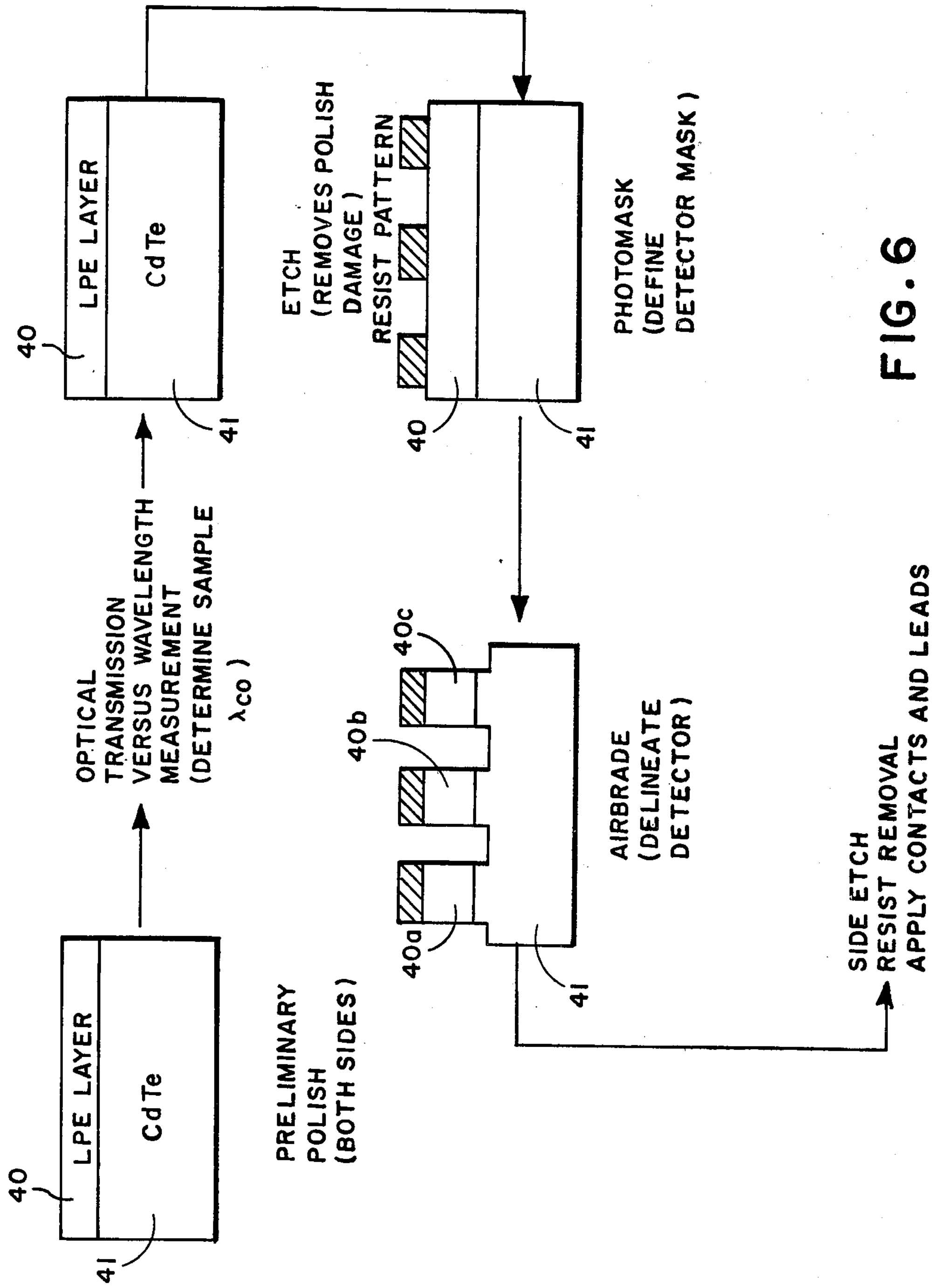
FIG. 6 shows a schematic flow diagram used in fabricating (Hg,Cd)Te detectors.

The most important evaluation of (Hg,Cd)Te layers grown by liquid phae epitaxy is their evaluation as infrared detectors. FIG. 6 shows a schematic flow diagram used in fabricating detectors from (Hg,Cd)Te samples formed by liquid phase epitaxy. The top surface of the (Hg,Cd)Te layer 40 and the back surface of CdTe substrate 41 first receive a preliminary polish. Optical transmission versus wavelength measurements are then made to determine the cutoff wavelength $\lambda_{co}$ for the sample. The surface of layer 40 is then etched to remove damage caused by polishing. A photoresist pattern is deposited on layer 40 to define the pattern of the individual detectors, and the detectors are delineated by air abrasion. Finally, the sides of detectors 40*a*, 40*b*, and 40*c* are etched, the photoresist is removed, and contact and leads are applied to the individual detectors.

The technique described in FIG. 6 was used to fabricate several detectors from Sample 21. As a result of the preliminary polishing step, the (Hg,Cd)Te layer was tapered rather than being of a uniform thickness. Since Sample 21 exhibited a compositional gradient through its thickness, tapering of the (Hg,Cd)Te layer exposed regions of different composition. For this reason, the individual detectors fabricated each exhibited a different cutoff wavelength $\lambda_{co}$.

Figure 7:
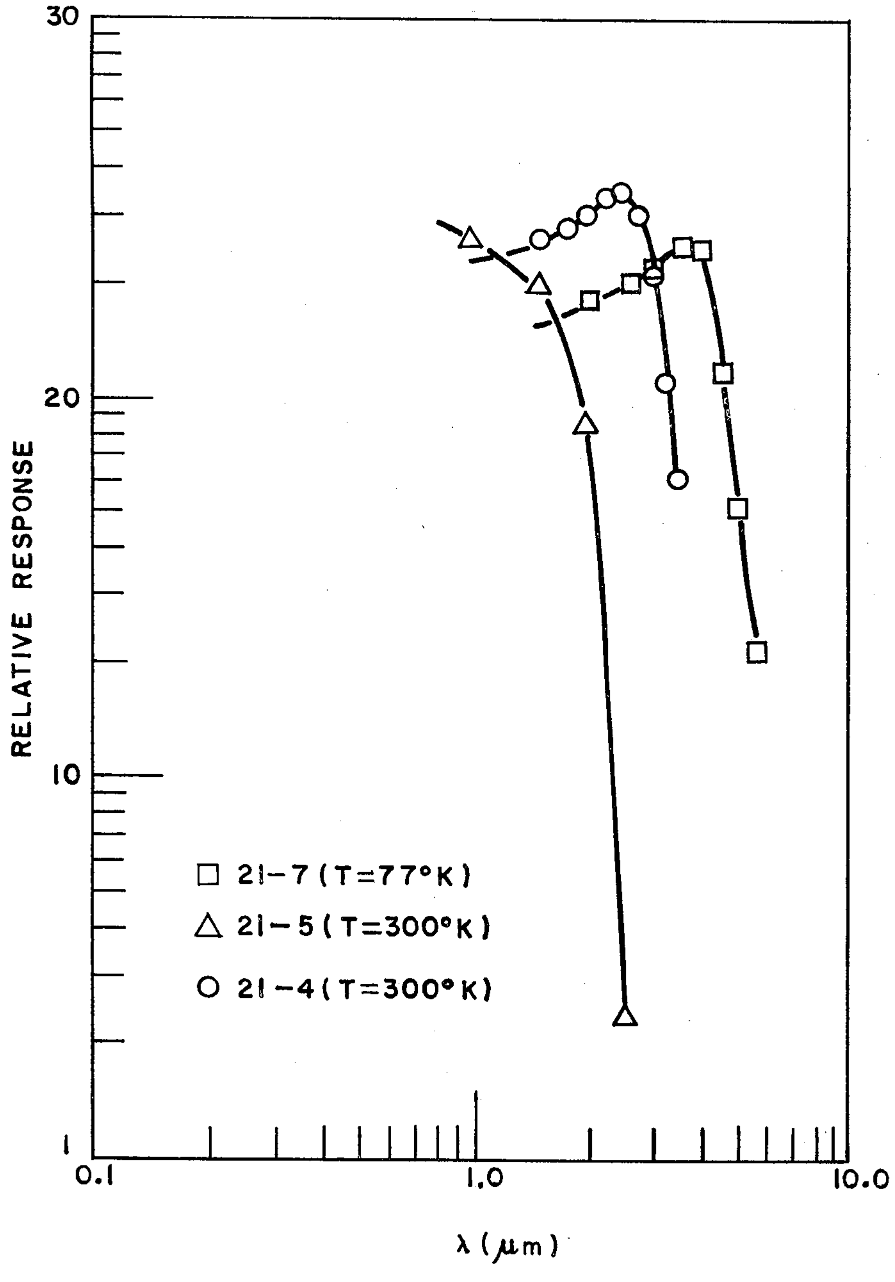
FIG. 7 shows relative response as a function of wavelength for three (Hg,Cd)Te detectors.

The relative response as a function of wavelength for three (Hg,Cd)Te detectors formed from Sample 21 is shown in FIG. 7. The relative response measurement for detectors 21-4 and 21-5 were made at 300°K, while the relative response measurements for detector 21-7 were made at 77°K.

Figure 8:
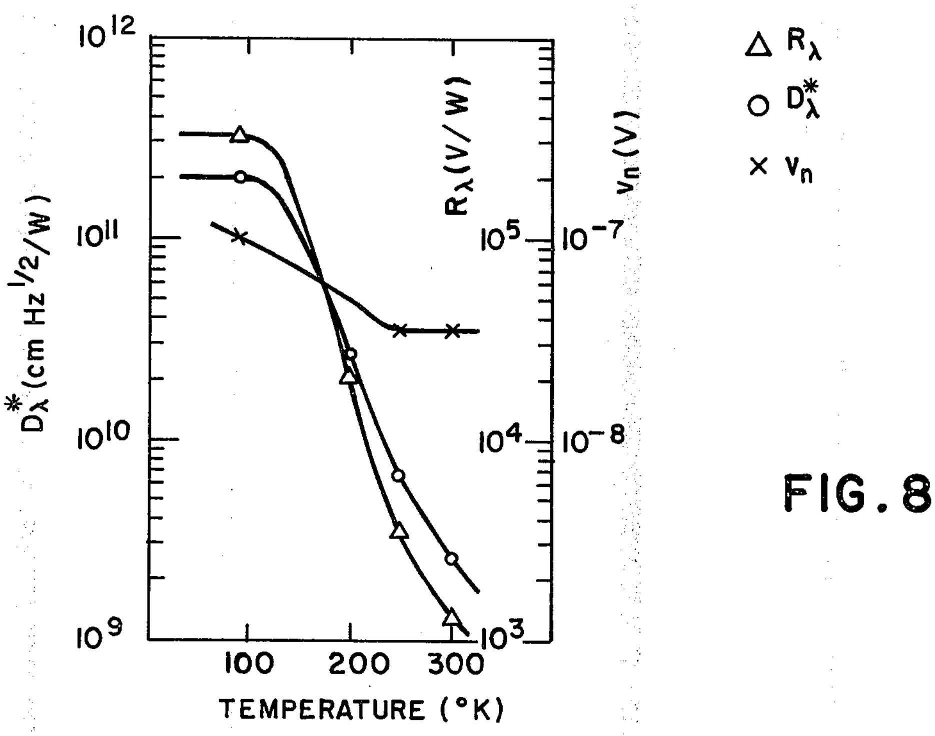
FIG. 8 shows specific detectivity $D^*_\lambda$, responsivity $R_\lambda$ and noise $V_n$ as a function of detector temperature.

FIG. 8 shows a plot of specific detectivity $D^*_\lambda$, responsivity $R_\lambda$, and noise $V_n$ as a function of detector temperature for detector 21-4. The solid lines drawn through the $D^*_\lambda$ and $R_\lambda$ data points represent the typical shape of curves obtained for detectors 21-4, 21-5, and 21-7. The strong temperature dependence of responsivity is indicative of minority carrier trapping.

Table 2 shows performance data obtained from detector elements 21-4, 21-5, and 21-7. The cutoff wavelength $\lambda_{co}$, detectivity $D^*_\lambda$, and resistance $R_D$ for each detector was measured at 1,000 Hz and a temperature of 87°K. The performance data shown in Table 2 compared favorably with the performance of high performance detectors prepared from bulk grown material having the same wavelength response.

TABLE 2

| Element No. | $\lambda_{co}$ (microns) | $R_D$ (ohms) | $D^*_\lambda$ (cm Hz½/W) |
|---|---|---|---|
| 21-4 | 3.1 | 1820 | 2.0×10¹¹ |
| 21-5 | 2.1 | 17800 | 3.5×10¹¹ |
| 21-7 | 4.5 | 2560 | 4.8×10⁹ |

A detector array was also fabricated from Sample 30. Each detector element had an active area of 0.007 by 0.007 inch. Detector array 30 was evaluated at 1,000 Hz at 78°K under low background flux ($Q_B$) conditions. The results are summarized in the following Table.

TABLE 3

| Element No. | $D^*_\gamma$ | $R_D$ (ohms) |
|---|---|---|
| 2 | 6.43×10 | 6 |
| 3 | 8.55×10 | 17 |
| 4 | 9.89×10 | 13 |
| 5 | 1.37×10 | 14 |
| 6 | 2.32×10 | 18 |
| 7 | 4.57×10 | 18 |
| 8 | 5.29×10 | 24 |
| 9 | 3.43×10 | 24 |
| 10 | 3.72×10 | 29 |
| 11 | 3.93×10 | 40 |
| 14 | 3.63×10 | 17 |
| 16 | 2.96×10 | 13 |
| 17 | 2.25×10 | 13 |
| 19 | 5.20×10 | 6 |
| 20 | 4.69×10 | 4 |
| 21 | 1.86×10 | 1 |
| 22 | 2.66×10 | 2 |

Figure 9:
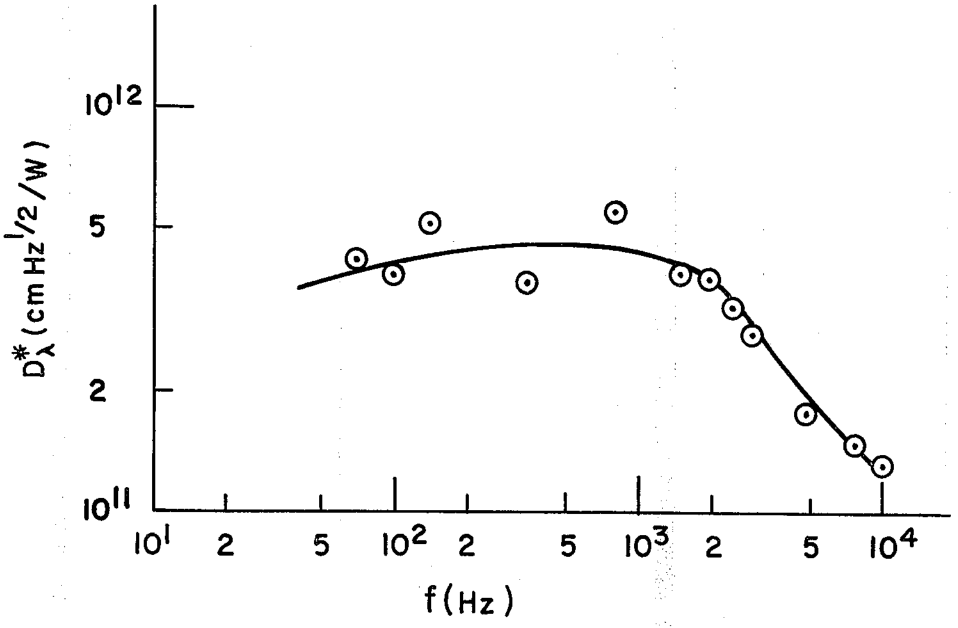
FIGS. 9 and 10 show the specific detectivity $D^*_\lambda$ as a function of frequency for elements 8 and 11, respectively, of a detector array from Sample 30.
Figure 10:
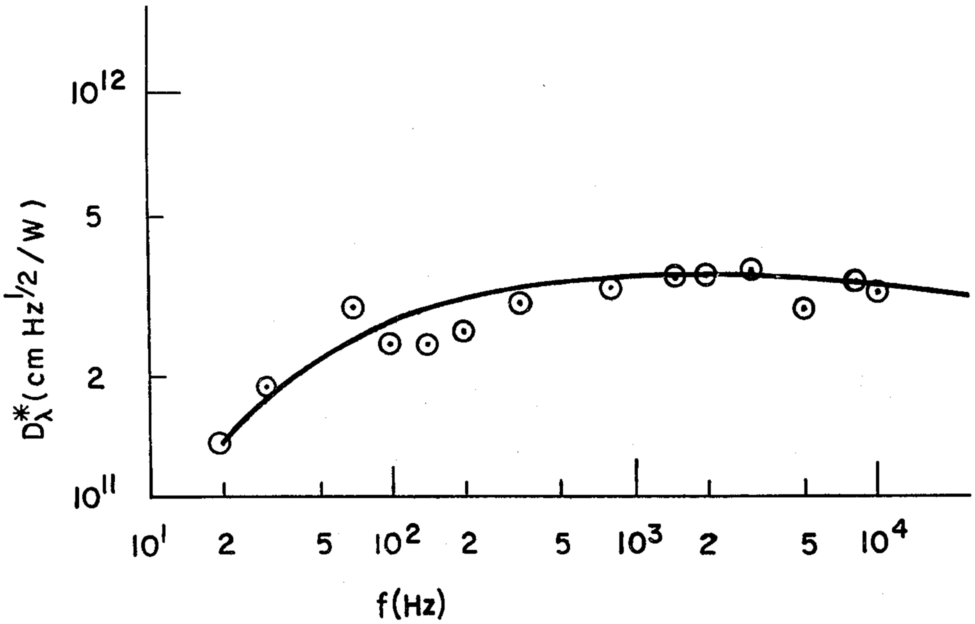

The specific detectivity as a function of frequency was determined for elements 8 and 11 of the array from Sample 30. FIGS. 9 and 10 show specific detectivity $D^*_\gamma$ as a function of frequency for elements 8 and 11, respectively.

A detector array was made directly from as-grown Sample 50. No etching or polishing of the surface of Sample 50 was attempted prior to formation of the detectors. The surface was not completely smooth and thus a few detectors were adversely affected. The active area of each detector element was 0.003 × 0.0034 inch.

Table 4 shows the black body detectivity $D^*_{BB}$ and resistance $R_D$ for eight detector elements from Sample 50. These measurements were made at 77°K. The spectral data for Sample 50 indicated that the cutoff wavelength $\lambda_{co}$ for each of these detector elements was about 4 microns.

TABLE 4

| Element No. | $R_D$ (ohms) | $D^*_{BB}$ (500°K, 10 kHz) |
|---|---|---|
| 59 | 27.5 | $1.8\times10^{11}$ |
| 60 | 36.5 | $1.8\times10^{11}$ |
| 61 | 43.8 | $1.3\times10^{11}$ |
| 62 | 23.1 | $0.35\times10^{11}$ |
| 63 | 18.8 | $0.7\times10^{11}$ |
| 64 | 18.4 | $0.14\times10^{11}$ |
| 65 | 15.8 | $0.24\times10^{11}$ |
| 66 | 15.1 | $0.24\times10^{11}$ |

A detector array fabricated from Sample 38 had elements with active areas of 0.0017 × 0.005 inch. The array was tested under high $Q_B$ conditions ($Q_B$=$10^{16}$ photons/cm$^2$ sec) at 77°K. Table 5 shows the resistance $R_D$ and black body detectivity $D^*_{BB}$ (500°K, 1 kHz) which were determined by these tests. Despite a few very high resistance elements, the uniformity was very good. Of the 32 elements, 24 had resistances within a factor of five (64 to 388 ohms). Seven detector elements had higher resistance, and one element was an open circuit. The spread in $D^*_{BB}$ was about an order of magnitude although 56% of the detector elements were in the range of 1.1 to $5.0\times10^9$ cm Hz ½/W.

TABLE 5

| Element No. | $R_D$ (ohms) | $D^*_{BB}$ (500°K, 1 kHz) |
|---|---|---|
| 1 | 91 | $5.8\times10^9$ |
| 2 | 84 | $8.2\times10^9$ |
| 3 | 425 | $1.3\times10^9$ |
| 4 | 8.29K | no signal |
| 5 | 3.2K | $1.1\times10^9$ |
| 6 | 43K | $24\times10^9$ |
| 7 | 330 | $4.3\times10^9$ |
| 8 | 222 | $2.9\times10^9$ |
| 9 | 211 | $2.8\times10^9$ |
| 10 | 280 | $2.8\times10^9$ |
| 11 | 188 | $4.0\times10^9$ |
| 12 | 99 | $2.2\times10^9$ |
| 13 | 80 | $9.6\times10^9$ |
| 14 | 75 | $7.8\times10^9$ |
| 15 | 96 | $1.4\times10^9$ |
| 16 | 104 | $8.3\times10^9$ |
| 17 | 101 | $15\times10^9$ |
| 18 | 64 | $10\times10^9$ |
| 19 | 86 | $2.9\times10^9$ |
| 20 | 87 | $7.2\times10^9$ |
| 21 | 118 | $2.1\times10^9$ |
| 22 | 122 | $5.1\times10^9$ |
| 23 | 147 | $11.4\times10^9$ |
| 24 | open | no signal |
| 25 | 180 | $2.2\times10^9$ |
| 26 | 175 | $5.0\times10^9$ |
| 27 | 230 | $1.9\times10^9$ |
| 28 | 238 | $2.4\times10^9$ |
| 29 | 338 | $2.0\times10^9$ |
| 30 | 560 | $2.0\times10^9$ |
| 31 | 926 | $1.9\times10^9$ |
| 32 | 21K | no signal |

Substrate Material

The selection of a substrate material for epitaxial growth can be based on a matching of a number of material properties. These include crystal structure, lattice spacing, and coefficient of thermal expansion. In addition, the substrate material and the epitaxial material should be chemically compatible over the temperature range of interest.

CdTe has several advantages as a substrate for (Hg,Cd)Te liquid phase epitaxial growth. First, CdTe is composed of two of the three atomic species of (Hg,Cd)Te. Second, CdTe is an insulating material and thus forms a high resistivity substrate. Third, the structure of CdTe is identical to the structure of (Hg,Cd)Te, and the lattice spacing of CdTe closely matches that of (Hg,Cd)Te. (Hg,Cd)Te layers grown on CdTe by liquid phase epitaxy exhibit excellent adherence to the substrate and are true epitaxial layers. In other words, the structure of the CdTe substrate and the as-grown (Hg,Cd)Te layer is the same and continuous across the interface.

There are two disadvantages, however, to the use of CdTe as a substrate material. First, CdTe interacts with the (Hg,Cd)Te layer during growth. Results show that the dissolution of CdTe is substantial. For example, in Sample 47 the substrate showed a 10.4 per cent decrease in thickness as a result of dissolution during the growth process. In fact, the final thickness of the substrate plus the (Hg,Cd)Te layer was less than the original substrate thickness. As previously described, the interaction of CdTe with (Hg,Cd)Te results in a compositional gradient near the interface of the substrate and the as-grown layer. Second, high resistivity CdTe is not readily available in large area single crystal form. Since the (Hg,Cd)Te epitaxial layer assumes the crystal structure of the substrate, it is desirable to use a single crystal rather than a polycrystalline substrate.

Despite the disadvantages of CdTe as a substrate material, high quality infrared detectors have been fabricated from liquid phase epitaxial film grown on CdTe substrates. The growth of (Hg,Cd)Te on CdTe substrates is reproducible, as demonstrated by Samples 47 and 65.

Other substrate materials have been investigated for liquid phase epitaxial growth of (Hg,Cd)Te. High resistivity silicon, germanium, spinel and sapphire are readily available in single crystal form.

As described in Example 5, (Hg,Cd)Te layers have been grown on (111) and (100) oriented substrates of silicon. Nucleation and growth on silicon substrates is more difficult than on CdTe substrates. This is to be expected since liquid phase epitaxial growth of (Hg,Cd)Te on CdTe is a homogenous process with a continuity of structure. Liquid phase epitaxial growth in (Hg,Cd)Te on silicon, on the other hand, is a heterogenous process.

Figure 11:
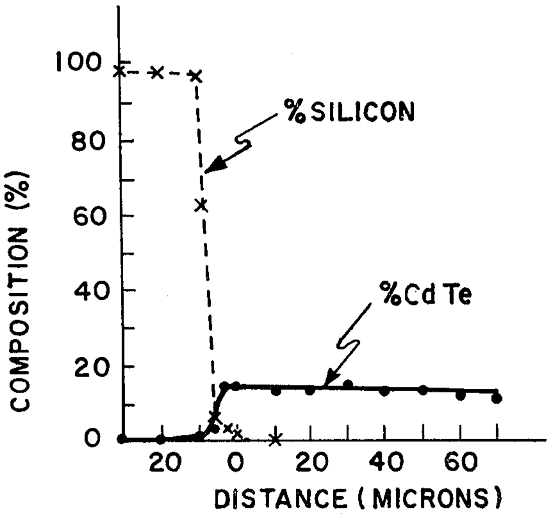
FIG. 11 shows composition as a function of distance for a (Hg,Cd)Te layer on a silicon substrate.

FIG. 11 is a plot of composition as a function of distance for Sample 12, which is a (Hg,Cd)Te layer grown on a (111) oriented silicon single crystal substrate. At the interface of the silicon substrate and the (Hg,Cd)Te layer, there was a sharp decrease in silicon and a corresponding sharp increase in (Hg,Cd)Te. The composition of the (Hg,Cd)Te layer was essentially uniform throughout the entire thickness of the layer. This characteristic differed from layers grown on CdTe substrates, which exhibited a compositional gradient throughout the thickness of the layer. Electron beam microprobe measurements also indicated a high degree of uniformity in the (Hg,Cd)Te layer across the surface of the layer.

Evaluation of (Hg,Cd)Te layers on silicon substrates has shown that (Hg,Cd)Te adheres poorly to either (111) or (100) oriented silicon substrates. Cracks were observed at the (Hg,Cd)Te—silicon interface; in fact, the (Hg,Cd)Te and silicon often separated during handling. It is believed that the major factor contributing to poor adherence is the oxide layer that forms on silicon. Although various substrate preparation processes are possible, they are not effective in complete removal of the oxide film. The oxide film forms at room temperature, and all epitaxial processes for silicon must be designed to remove this oxide in the growth ampoule so that the epitaxial growth layers can be deposited on an oxide free surface. In the semiconductor industry, high temperature gaseous reactions are used to remove the oxide and grow epitaxial layers in the same process step. This type of procedure, however, is not feasible in liquid phase epitaxial growth of (Hg,Cd)Te.

One procedure for overcoming the oxide problem on silicon was described in Example 8. A (110) oriented silicon substrate was sputter etched to remove the oxide layer. While the silicon substrate was still in the sputtering apparatus, a layer of CdTe of about 500 A to 1,000 A was deposited on the oxide free surface. The CdTe coated substrate was then removed from the sputtering apparatus and used as a substrate for liquid phase epitaxial growth of (Hg,Cd)Te. The results of the liquid phase epitaxial growth indicated that the problem of the oxide layer had been overcome. Unfortunately, the growth was unsuccessful due to reaction of silicon with the melt.

Germanium is also readily available in single crystal form and does not form the adherent type of oxide typical of silicon. Attempts to grow (Hg,Cd)Te layers on germanium substrates by liquid phase epitaxy, however, have not proved successful. Germanium substrates were completely dissolved by the (Hg,Cd)Te solution. This is the result of a reaction between germanium and tellurium. Germanium is not a suitable substrate material when growth temperatures of about 700°C are used.

The use of a substrate material such as spinel ($MgAl_2O_4$) or sapphire ($Al_2O_3$) is most appealing in that there should be no reaction between the substrate material and the melt. Instead of a diffusion type boundary like that seen with CdTe substrates, there should be a sharp change in composition at the film--substrate boundary. In addition, the composition of the (Hg,Cd)Te layer should be more uniform in thickness. Earlier liquid phase epitaxial growth of (Hg,Cd)Te on silicon showed this desirable type of behavior. As described in Example 10, initial attempts to grow (Hg,Cd)Te directly on spinel were unsuccessful. When the spinel was first sputter etched and a 500 A to 1,000 A layer of CdTe was then deposited on the cleaned surface, growth of a (Hg,Cd)Te layer was successful. Unlike the preparation of silicon substrates, the sputter etching of spinel or sapphire was not used to remove an oxide layer, but rather to clean the surface and to promote bonding between the (Hg,Cd)Te layer and the substrate. The CdTe layer was used to maintain the clean surface and to promote bonding.

Metallographic analysis using scanning electron microscope techniques showed an excellent bond at the interface between the (Hg,Cd)Te layer and the spinel or sapphire substrate. Both spinel and sapphire substrates, therefore, are preferred substrates for liquid phase epitaxial growth of (Hg,Cd)Te.

Another promising substrate material for liquid phase epitaxial growth of (Hg,Cd)Te is quartz. Advantages of quartz as a substrate include its availability and the fact that it is readily wetted by CdTe and (Hg,Cd)Te. In addition, since quartz is an amorphous material, growth will not be determined by orientation effects.

Quartz ampoules in which (Hg,Cd)Te has been grown generally exhibit a thin layer of (Hg,Cd)Te which has adhered to the wall of the ampoule. Scanning electron microscope techniques have been used to investigate the bond between the (Hg,Cd)Te and the quartz. These metallographic examinations have shown an excellent bond between the (Hg,Cd)Te and the quartz. These results indicate that quartz is an advantageous substrate material.

Importance of Growth Conditions

In general, the composition, thickness, and surface condition of (Hg,Cd)Te layers grown by liquid phase epitaxy are dependent upon several growth conditions. These include (1) substrate material and crystal orientation, (2) the method of producing supersaturation and growth, (3) starting temperature and final or decant temperature, (4) melt composition, and (5) cooling rate and time of growth.

As described in the previous section, (Hg,Cd)Te layers have been grown by liquid phase epitaxy on CdTe, silicon, spinel, and sapphire substrates. Liquid phase epitaxial growth is most readily achieved when CdTe substrates are used since it is a homogeneous process.

Thin films of (Hg,Cd)Te grown by liquid phase epitaxy are generally of higher quality when uniform cooling is used as the driving force for supersaturation and growth. Uniform cooling of the melt is therefore preferred over the temperature gradient technique which was also described.

The temperature at the end of growth when the melt is decanted is the growth condition most critical to final composition at the surface of the as-grown (Hg,Cd)Te layers. Lower decant temperatures result in lower $x$ values; high decant temperatures result in high $x$ values. For example, a final decant temperature of 700°C results in an $x$ value of about 0.21 at the surface of the as-grown (Hg,Cd)Te layer. The decant temperature of 690°C, on the other hand, results in an $x$ value of about 0.20.

The composition of the melt affects the composition of the surface of the (Hg,Cd)Te layers. As mentioned earlier, with CdTe substrates there is a significant dissolution of the CdTe during liquid phase epitaxial growth. The dissolution leads to a change in melt composition causing it to have a higher $x$ value than expected from the phase diagram. In addition, a diffusion reaction occurs between the CdTe substrate and the as-grown (Hg,Cd)Te layer. This also causes the final film composition to be higher in $x$ and leads to a compositional gradient through the thickness of the film.

It might be thought that the interactions between the CdTe substrate and the (Hg,Cd)Te would make composition control extremely difficult. In fact, however, the interactions can be anticipated and in effect controlled through the use of a melt which is lower in $x$ than indicated by the pseudo-binary phase diagram plus proper control of temperature and cooling rate. For example, the pesudo-binary phase diagram indicates that a melt of $x$=0.065 would yield liquid phase epitaxial films of $x$=0.20. Because of the dissolution and diffusion reaction, it is in fact necessary to use a melt of $x$=0.035 to obtain a layer of $x$=0.20 by liquid phase epitaxial growth on a CdTe substrate.

For the fabrication of infrared detector arrays it is most important (a) to maintain uniformity in composition across the surface of the as-grown layer, (b) to produce as steep a compositional gradient as possible through the thickness of the layer, and (c) to maintain a (Hg,Cd)Te layer--substrate interface that is plane and parallel to the original substrate surface. (Hg,Cd)Te layers grown at fast cooling rates (greater than 5°C per/min) show the desired steep compositional gradient and a plane and parallel interface, but not the required uniformity in composition across the surface of the as-grown layer. Layers grown at slow cooling rates (0.5°C per/min or less) result in excellent uniformity in composition but the compositional gradient is not steep and the (Hg,Cd)Te--substrate interface does not remain parallel to the original surface. This leads to the use of an intermediate cooling rate that is slow enough to give the required control of composition uniformity, but not too slow to give undesirable composition gradients and loss of interface shaped control. For the growth of (Hg,Cd)Te on CdTe substrates, this intermediate cooling rate has been found to be about 1°C per/min.

It has therefore been found that the composition, thickness, and surface condition of (Hg,Cd)Te layers grown by liquid phase epitaxy can be selected and adjusted by altering one or more of the growth conditions. For example, the most desirable growth conditions for achieving high quality (Hg,Cd)Te layers having $x$=0.20 on CdTe substrates are: starting temperature of about 705°C, decant temperature of about 690°C, cooling rate of about 1°C per/min, growth time about 15 minutes, and initial melt composition of $x$=0.035.

Conclusion

In the present invention, high quality detector grade (Hg,Cd)Te layers have been formed on a substrate by a liquid phase epitaxial growth technique. This technique has several advantages. First, the (Hg,Cd)Te layers are grown on an insulating substrate. Many of the post-growth processing steps required to make detectors from bulk grown (Hg,Cd)Te are thus avoided. The liquid phase epitaxial films are particularly advantageous for fabrication of detector arrays. Second, since layers of (Hg,Cd)Te grown by liquid phase epitaxy are grown directly on the substrate, the epoxy layer used in present (Hg,Cd)Te detectors is eliminated. Third, (Hg,Cd)Te layers grown by liquid phase epitaxy are grown at lower temperatures than directly solidifed bulk (Hg,Cd)Te of the same $x$ value. Liquid phase epitaxy thus presents a means for reducing stoichiometric and foreign impurity defects in (Hg,Cd)Te.

The present invention has been disclosed with reference to a series of preferred embodiments and specific examples. Changes in form and detail, however, may be made without departing from the spirit and scope of the invention. As previously discussed, the sizes of the ampoules, substrates and melt charge described in the examples were selected on the basis of convenience. The amounts and sizes mentioned could either be increased or decreased depending upon the surface area of the film desired.

The apparatus shown in FIGS. 1 and 2 represents but one possible technique for bringing a substrate in contact with a liquid solution of (Hg,Cd)Te. More elaborate techniques, such as the well-known "wiping" and "dipping" methods used in liquid phase epitaxy of other materials, may also be used.

The embodiments of the invention in which an exclusive property or right is claimed are defined as follows:

1. A method of forming a layer of mercury cadmium telluride of a desired composition on a substrate, the method comprising:

contacting a surface of the substrate with a liquid solution of about $1-x$ mole part mercury, about $x$ mole part cadmium, and about 1 mole part tellurium, wherein $x$ is between 0 and 1, and the liquid solution proximate the surface of the substrate having a liquidus temperature substantially identical to the solidus temperature of the desired composition of mercury cadmium telluride, and producing supersaturation and growth of a layer of mercury cadmium telluride on the surface of the substrate.

2. The method of claim 1 wherein the volume of liquid solution is much greater than the volume of the layer of mercury cadmium telluride.

3. The method of claim 2 and further comprising: removing excess liquid solution from contact with the layer of mercury cadmium telluride.

4. The method of claim 1 wherein producing supersaturation and growth comprises cooling the liquid solution.

5. The method of claim 4 wherein the liquid solution is cooled at a rate of less than about 6°C per minute.

6. The method of claim 5 wherein the liquid solution is cooled at a rate of about 1°C per minute.

7. The method of claim 4 wherein cooling the liquid solution comprises establishing a temperature gradient in the solution in a direction perpendicular to the surface of the substrate.

8. The method of claim 1 wherein the substrate is cadmium telluride.

9. The method of claim 8 wherein $x$=about 0.035.

10. The method of claim 1 wherein the substrate is a $MgAl_2O_4$ substrate having a cadmium telluride coated surface.

11. A low temperature growth method for forming mercury cadmium telluride layers on a substrate, the method comprising:

forming a liquid solution of mercury, cadmium, and tellurium in a closed container, the amount of mercury plus cadmium in the liquid solution being approximately equal to the amount of tellurium in the solution, contacting the liquid solution with a substrate, cooling the solution to cause supersaturation and growth of a layer of mercury cadmium telluride on the substrate, the volume of the mercury cadmium telluride layer being much less than the volume of the remaining liquid solution, and terminating contact of the liquid solution with the layer of mercury cadmium telluride.

12. The method of claim 11 wherein the liquid solution is cooled at a rate of less than about 6°C per minute.

13. The method of claim 12 wherein the liquid solution is cooled at a rate of about 1°C per minute.

14. The method of claim 11 wherein the substrate is cadmium telluride.

15. The method of claim 14 wherein $x$, the mole fraction of cadmium telluride in the solution, is about 0.20.

16. The method of claim 14 wherein $x$, the mole fraction of cadmium telluride in the liquid solution, is about 0.065.

17. The method of claim 16 wherein the liquid solution has a temperature of about 715°C to about 725°C when the liquid solution is contacted with the substrate.

18. The method of claim 17 wherein the liquid solution has a temperature of about 690°C to about 720°C when contact of the liquid solution with the layer of mercury cadmium telluride is terminated.

19. The method of claim 18 wherein the liquid solution is cooled at a rate of less than 6°C per minute.

20. The method of claim 19 wherein the liquid solution is cooled at a rate of about 1°C per minute.

21. The method of claim 14 wherein $x$, the mole fraction of cadmium telluride in the liquid solution, is about 0.035.

22. The method of claim 21 wherein the liquid solution has a temperature of about 694°C to about 715°C when the liquid solution is contacted with the substrate.

23. The method of claim 22 wherein the liquid solution has a temperature of about 686°C to about 705°C when contact of the liquid solution with the layer of mercury cadmium telluride is terminated.

24. The method of claim 23 wherein the liquid solution has cooled at a rate of between 0.1°C per minute to about 4.0°C per minute.

25. The method of claim 24 wherein the liquid solution is cooled at a rate of about 1°C per minute.

26. The method of claim 25 wherein the liquid solution has a temperature of about 690°C when contact of the liquid solution with the layer of mercury cadmium telluride is terminated.

27. The method of claim 26 wherein the liquid solution has a temperature of about 705°C when the liquid solution is contacted with the substrate.

28. The method of claim 11 wherein the liquid solution contains a slight excess of mercury.

29. The method of claim 11 and further comprising rapidly cooling the substrate and the mercury cadmium telluride layer to a temperature substantially below the solidus temperature of the mercury cadmium telluride layer after terminating contact with the liquid solution.

30. The method of claim 11 wherein the substrate is a $MgAl_2O_4$ substrate having a cadmium telluride coated surface.

31. The method of claim 11 wherein the substrate is a sapphire substrate having a cadmium telluride coated surface.

32. The method of claim 11 wherein the substrate is a quartz substrate having a cadmium telluride coated surface.

33. A semiconductor device formed by the method of claim 11, said semiconductor device comprising a layer of liquid phase epitaxially grown $Hg_{1-x}Cd_xTe$ on a substrate.

* * * * *